(12) United States Patent
Weiss

(10) Patent No.: US 7,336,091 B2
(45) Date of Patent: Feb. 26, 2008

(54) ASSEMBLY FOR SIMULTANEOUSLY TESTING MULTIPLE ELECTRONIC COMPONENTS

(76) Inventor: Roger E. Weiss, 10 Mary Way, Foxboro, MA (US) 02035

(*) Notice: Subject to any disclaimer, the term of this patent is extended or adjusted under 35 U.S.C. 154(b) by 92 days.

(21) Appl. No.: 11/296,654

(22) Filed: Dec. 7, 2005

(65) Prior Publication Data

US 2007/0026746 A1 Feb. 1, 2007

Related U.S. Application Data

(60) Provisional application No. 60/634,037, filed on Dec. 7, 2004.

(51) Int. Cl.
*G01R 31/26* (2006.01)
(52) U.S. Cl. ...................................... 324/765
(58) Field of Classification Search ................ 324/765
See application file for complete search history.

(56) References Cited

U.S. PATENT DOCUMENTS

| 4,968,931 | A * | 11/1990 | Littlebury et al. ........... 324/760 |
| 6,228,687 | B1 * | 5/2001 | Akram et al. ................ 438/125 |
| 2003/0166355 | A1 * | 9/2003 | Simons et al. ............... 439/331 |
| 2003/0224633 | A1 * | 12/2003 | Weiss ........................... 439/91 |
| 2004/0080329 | A1 * | 4/2004 | Jain ............................ 324/765 |

* cited by examiner

*Primary Examiner*—Ha Tran Nguyen
*Assistant Examiner*—Trung Q. Nguyen
(74) *Attorney, Agent, or Firm*—Brian M. Dingman; Mirick, O'Connell, DeMallie + Lougee, LLP

(57) ABSTRACT

An assembly for simultaneously electrically testing a plurality of electronic components. There is a test fixture, and a lead frame carrying a plurality of electronic components to be tested, each such electronic component having multiple electrical leads. A layer of Anisotropic Conductive Elastomer (ACE) is in contact with the test fixture and in contact with the leads of the plurality of electronic components. There is a device for applying a compressive force to the leads, the ACE and the test fixture, to make electrical contact between the leads and the test fixture through the ACE.

18 Claims, 2 Drawing Sheets

ASSEMBLY FOR SIMULTANEOUSLY TESTING MULTIPLE ELECTRONIC COMPONENTS

CROSS REFERENCE TO RELATED APPLICATION

This application claims priority of provisional application Ser. No. 60/634,037 filed on Dec. 7, 2004.

FIELD OF THE INVENTION

This invention relates to an assembly for simultaneously testing a number of electronic components.

BACKGROUND OF THE INVENTION

Many electronic components, such as integrated circuits, are packaged by mounting a die onto metal electrical contacts, and subsequently encapsulating the die and part of the contact structure in a polymer material. The metal contacts are partially stamped from a flat strip of metal with a web of metal left in the strip to retain and register the contacts during the manufacturing process. These strips are sometimes called "lead frames." The strip typically has guide holes on the edges to accurately control its position as it passes through the various pieces of assembly equipment. Once the assembly is complete, the completed device is cut from the lead frame by a punch and die operation ("singulation") and the contacts bent into their final shape. The individual devices are then tested in test sockets which are designed to hold a single component.

With the miniaturization of components, it is now possible to build hundreds of components on a single lead frame structure. This provides a significant cost reduction in the manufacturing process, but introduces a serious handling problem once the small parts have been singulated from the lead frame. This can result in the dropping of parts causing reduced yield through the testing and packaging process. The invention herein makes it possible to test the components while still in the lead frame, and thus reduce part loss during the testing stage.

Anisotropic Conductive Elastomer

Anisotropic Conductive Elastomer (ACE) is a composite of conductive metal elements in an elastomeric matrix that is normally constructed such that it conducts along one axis only. In general this type of material is made to conduct through its thickness. Anisotropic conductivity is achieved in one form of ACE by mixing magnetic particles with a liquid resin, forming the mix into a continuous sheet and curing the sheet in the presence of a magnetic field. This results in the particles forming multiple separate but closely-spaced electrically conductive columns through the sheet thickness, each column separated from the others by cured insulating resin. Another group of ACE materials is constructed by embedding fine wire in a polymer matrix. The resulting structure has the unique property of being both flexible and anisotropically conductive. These ACE materials can be constructed in large, continuous sheets, which can provide separable electrical interconnection over an extended area.

SUMMARY OF THE INVENTION

This invention features an assembly for simultaneously electrically testing a plurality of electronic components, comprising a test fixture, a lead frame carrying a plurality of electronic components to be tested, each such electronic component having multiple electrical leads, a layer of Anisotropic Conductive Elastomer (ACE) in contact with the test fixture and in contact with the leads of the plurality of electronic components, and a device for applying a compressive force to the leads, the ACE and the test fixture, to make electrical contact between the leads and the test fixture through the ACE.

The test fixture may comprise a printed circuit board having contacts that electrically connect to the leads of the electronic components to be tested. The ACE may comprise magnetic particles aligned in conductive columns. The device for applying a compressive force to the leads, the ACE and the test fixture may comprise a hydraulic bladder, and may further comprise a load member for selectively applying a compressive force to the bladder.

The device for applying a compressive force to the leads, the ACE and the test fixture may comprise a conformal surface placed against the lead frame, to transfer force to the frame and not the components. The conformal surface may be flexible. The device for applying a compressive force to the leads, the ACE and the test fixture may further comprise a load member for selectively applying a compressive force to the conformal surface.

The assembly may further comprise a rigid or flexible circuit element between the lead frame and the ACE, with conductors located so as to electrically connect the leads of the components to be tested. A second layer of ACE may be located between the lead frame and this rigid or flexible circuit element. The flexible circuit element conductors may comprise conductive vias with conductive pads on the surfaces of the flex circuit and in electrical contact with the vias.

The ACE may be larger than the test fixture, and the assembly may further comprise a device to move the ACE relative to the test fixture. The device to move the ACE relative to the test fixture may comprise a two-axis translation device and/or a reel-to-reel ACE movement device.

BRIEF DESCRIPTION OF THE DRAWINGS

Other objects, features and advantages will occur to those skilled in the art from the following description of the preferred embodiments and the accompanying drawings, in which.

DESCRIPTION OF THE PREFERRED EMBODIMENTS OF THE INVENTION

The invention utilizes ACE materials to facilitate the testing of multiple electronic components prior to singulation, while the components are still mounted in the lead frame. This eliminates the need for a conventional test socket, and greatly reduces the cost of testing.

Figure 1:
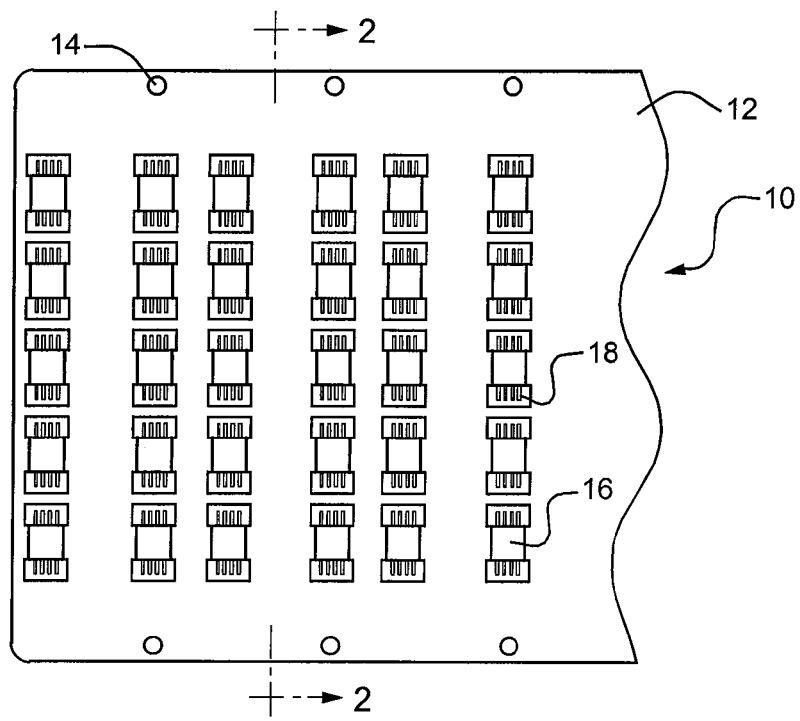
FIG. 1 is a partial top view of a lead frame carrying a plurality of electronic components for this invention.

FIG. 1 shows lead frame 10 comprising strip 12 carrying a number of electronic components 16, each having a number of electrical leads 18. Strip 12 defines registration holes 14.

Figure 2:
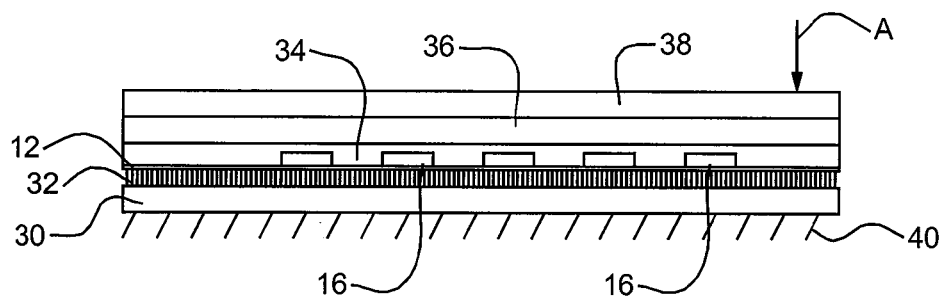
FIG. 2 is a schematic cross-sectional view taken along line 2-2 of FIG. 1, and showing the portions of the assembly not shown in FIG. 1.

FIG. 2 presents a schematic view of an embodiment of the invention. Test fixture 30 (which may be a printed circuit board), is mounted in a test machine (only the support base 40 of the test machine shown). Test fixture 30 has circuitry on its top face that mates to leads 18 of a multiplicity of components 16. The relative orientation of component leads 18 is well controlled by lead frame strip 12; the sprocket holes 14 facilitate the orientation of the lead frame to the test machine and test board, for example using sprockets or pins (not shown). ACE material layer 32 requires no orientation and is placed between lead frame 12 and test board 30.

After the lead frame has been moved into proper orientation, a load member moves from above the lead frame (in the direction of arrow A) to compress component leads 18 through the ACE material, to make electrical contact between the leads and the board. This simultaneously electrically connects a multiplicity of components to the board. Once the components have been tested, they can be identified as to their acceptability relative to their location in the frame.

In one preferred embodiment, the load member utilizes a hydraulic bladder 36 to provide a uniform load across lead frame 12. This can optionally be combined with a shaped (conformal) surface 34 that focuses the applied load in the contact area rather than on the encapsulated portion of the package that includes components 16. Surface 34 can be flexible to assist in the application of compressive force to leads 18. Load member 38 may be a load plate that is placed on bladder 36 to provide the necessary compressive force.

Figure 3A:
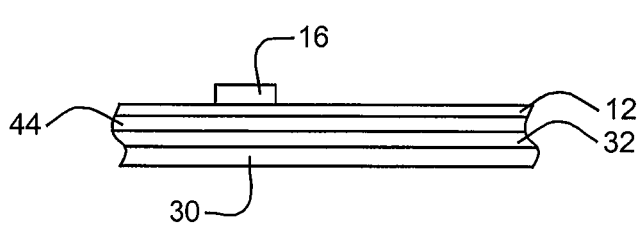
FIG. 3A is a simplified, enlarged partial view of an alternative to FIG. 2 employing a flexible circuit element.
Figure 3B:
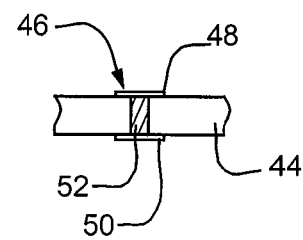
FIG. 3B is an enlarged partial view of the flexible circuit of FIG. 3A.

Another preferred embodiment is shown in FIGS. 3A and 3B. Interposed printed circuit or flex circuit board 44 can be placed between lead frame 12 and test board 30. A second layer of ACE material (not shown in the drawing) can be placed between lead frame 12 and interposed board 44 to accomplish separable electrical interconnectivity. Board 44 can accomplish one or all of several functions. For one, this interposed board provides greater physical separation between the lead frame and the test board, thus decreasing the possibility of the lead frame damaging the test board. Also, the interposed board prevents the lead frame from contacting the ACE material layer 32, which decreases wear and thus increases the useful life of the ACE. In these cases, the interposed board is in a sense sacrificial.

Another function that the interposed board can accomplish is to translate the pattern of component leads on the lead frame to the lands and other conductors on the surface of the test board that must be electrically connected in order to accomplish a proper test of the components carried by the lead frame. This translation is necessary unless each of the leads lies directly above the proper location on the test board at which the lead needs to make electrical contact. For example, a single test board is sometimes used to test slightly different component configurations on lead frames. These different component configurations may have leads in somewhat different locations relative to the test board. In this case the interposed additional board would need to be a multilayer board that physically reroutes electrical signals flowing between the test board and the components on the lead frame as necessary to accomplish the desired interconnection.

FIG. 3B schematically depicts a flexible board embodiment of interposed board 44, with through vias 52 interconnecting upper and lower pads 46 and 50, respectively, located on the same footprint as the array of device leads. When mounted between the lead frame 12 and the ACE material 32, flexible circuit 44 would serve as a wear member to increase ACE utilization. This may be useful in a situation in which the device leads have sharp edges, for example.

Figure 4:
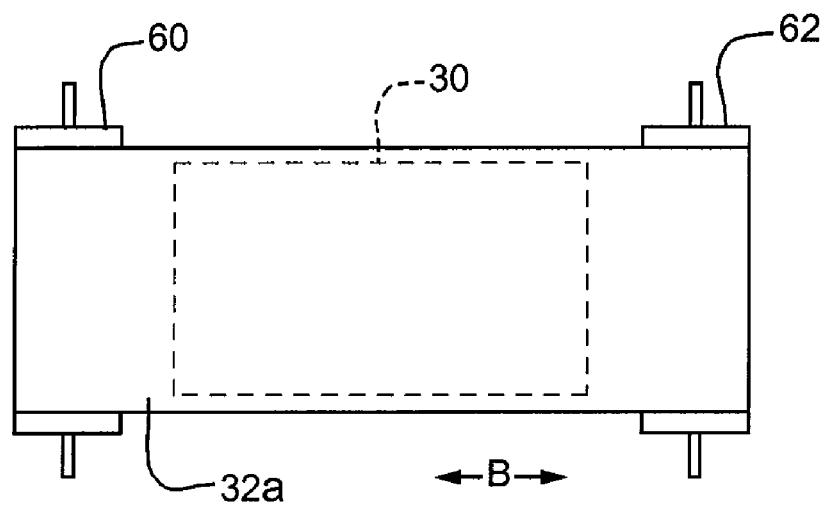
FIG. 4 is a top schematic view of a roll transfer system for feeding ACE material relative to the test board, for this invention.
Figure 5:
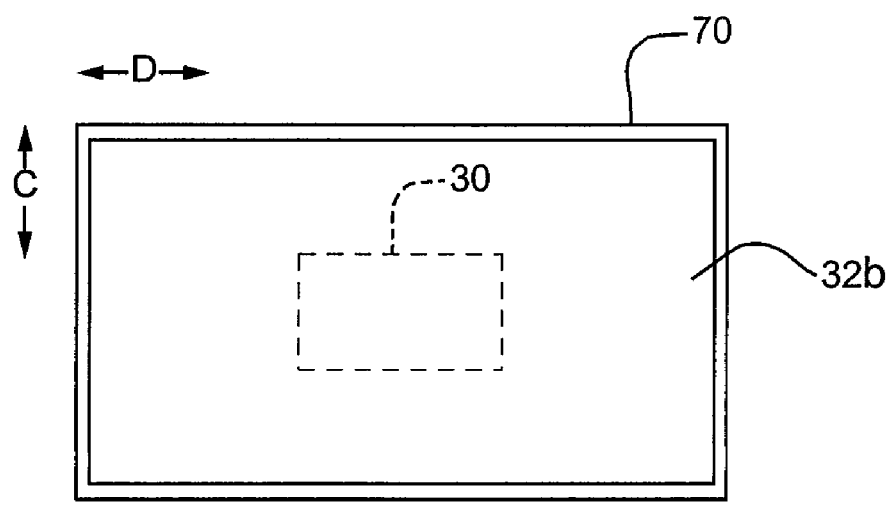
FIG. 5 is a similar view of an x-y translation stage for moving the ACE material relative to the test board.

In yet another preferred embodiment, the ACE material sheet 32a, FIG. 4, can be larger than test board 30, and can be automatically, periodically moved relative to the test board to fully utilize the entire sheet. This motion would occur when the frame was not being compressed to the test board. This can be accomplished in a reel-to-reel motion to continuously bring new contact capability into play as needed, as shown in FIG. 4, in which ACE sheet 32a is moved in the direction of arrow B between rotatable rolls 60 and 62. This reel-to-reel motion could be combined with an x-y pattern of motion, FIG. 5, to maximize material utilization, or the x-y translation can be used rather than the reel-to-reel translation. Frame 70, FIG. 5, carries ACE sheet 32b and is adapted to be moved in the directions of arrows C and D to accomplish x-y translational motion of the ACE material relative to test board 30.

Although specific features of the invention are shown in some drawings and not others, this is for convenience only as some feature may be combined with any or all of the other features in accordance with the invention.

Other embodiments will occur to those skilled in the art and are within the following claims:

What is claimed is:

1. An assembly for simultaneously electrically testing a plurality of electronic components, comprising:
    a test fixture;
    a lead frame carrying a plurality of electronic components to be tested, each such electronic component having multiple electrical leads;
    a layer of Anisotropic Conductive Elastomer (ACE) in contact with the test fixture and in contact with the leads of the plurality of electronic components, wherein the layer of ACE is larger than the test fixture;
    a device for applying a compressive force to the leads, the ACE and the test fixture, to make electrical contact between the leads and the test fixture through the ACE; and
    a device to move the ACE relative to the test fixture.

2. The assembly of claim 1 wherein the test fixture comprises a printed circuit board having contacts that electrically connect to the leads of the electronic components to be tested.

3. The assembly of claim 1 wherein the ACE comprises magnetic particles aligned in conductive columns.

4. The assembly of claim 1 wherein the device for applying a compressive force to the leads, the ACE and the test fixture comprises a hydraulic bladder.

5. The assembly of claim 4 wherein the device for applying a compressive force to the leads, the ACE and the test fixture further comprises a load member for selectively applying a compressive force to the bladder.

6. The assembly of claim 1 wherein the device for applying a compressive force to the leads, the ACE and the test fixture comprises a conformal surface placed against the lead frame, to transfer force to the frame and not the components.

7. The assembly of claim 6 wherein the conformal surface is flexible.

8. The assembly of claim 6 wherein the device for applying a compressive force to the leads, the ACE and the test fixture further comprises a load member for selectively applying a compressive force to the conformal surface.

9. The assembly of claim 1 further comprising a rigid or flexible circuit element between the lead frame and the ACE, the circuit element having conductors located so as to electrically connect to the leads of the components to be tested.

10. The assembly of claim 9 wherein the flexible circuit element conductors comprise conductive vias with conductive pads on the surfaces of the flexible circuit element in electrical contact with the vias.

11. The assembly of claim 9 further comprising another layer of ACE between the lead frame and the rigid or flexible circuit element.

12. The assembly of claim 1 wherein the device to move the ACE relative to the test fixture comprises a two-axis translation device.

13. The assembly of claim 1 wherein the device to move the ACE relative to the test fixture comprises a reel-to-reel ACE movement device.

14. An assembly for simultaneously electrically testing a plurality of electronic components, comprising:
- a test printed circuit board;
- a lead frame carrying a plurality of electronic components to be tested, each such electronic component having multiple electrical leads;
- a layer of Anisotropic Conductive Elastomer (ACE) in contact with the test printed circuit board and in contact with the leads of the plurality of electronic components, wherein the layer of ACE is larger than the test printed circuit board and comprises magnetic particles aligned in conductive columns;
- a device for applying a compressive force to the leads, the ACE and the test printed circuit board, to make electrical contact between the leads and the test printed circuit board through the ACE, wherein the device for applying a compressive force to the leads, the ACE and the test printed circuit board comprises a hydraulic bladder and a load member for selectively applying a compressive force to the bladder; and
- a device to move the ACE relative to the test printed circuit board.

15. The assembly of claim 14 wherein the device for applying a compressive force to the leads, the ACE and the test fixture further comprises a flexible conformal surface placed against the lead frame, to transfer force to the frame and not the components.

16. The assembly of claim 14 further comprising a rigid or flexible circuit element between the lead frame and the ACE having conductors located so as to electrically connect to the leads of the components to be tested.

17. The assembly of claim 16 further comprising another layer of ACE between the lead frame and the rigid or flexible circuit element.

18. The assembly of claim 16 wherein the flexible circuit element conductors comprise conductive vias with conductive pads on the surfaces of the flexible circuit element in electrical contact with the vias.

* * * * *